March 5, 1963 J. J. DAVIDSON 3,080,528
TRANSISTOR AMPLIFIER CIRCUITS UTILIZING A ZENER DIODE FOR STABILIZATION
Filed April 21, 1960
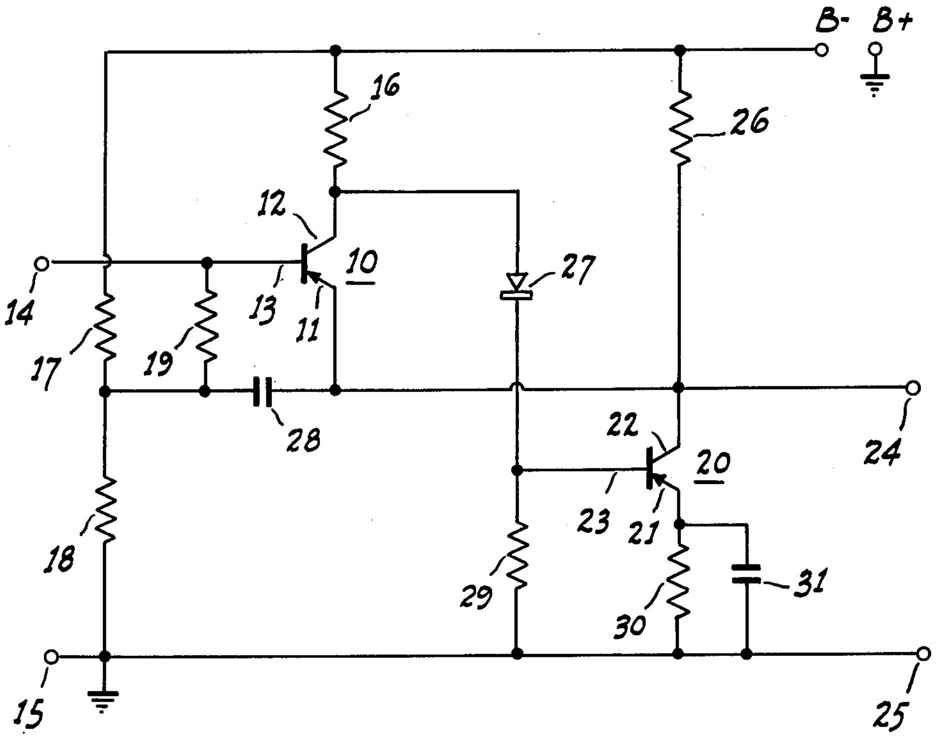
INVENTOR.
JAMES J. DAVIDSON
BY Eugene M. Whitacre
ATTORNEY 3,080,528

TRANSISTOR AMPLIFIER CIRCUITS UTILIZING A ZENER DIODE FOR STABILIZATION

James J. Davidson, Lawrence Township, Marion County, Ind., assignor to Radio Corporation of America, a corporation of Delaware Filed Apr. 21, 1960, Ser. No. 23,856
7 Claims. (Cl. 330—22)

This invention relates to signal translating circuits, and in particular to signal amplifier circuits utilizing semiconductor signal amplifying devices such as transistors.

The alternating current input impedance of a transistor is normally relatively low. This characteristic is not desirable in circuit applications where a transistor is used and the impedance of the signal source is relatively high. Such circuits might include, for example, a signal source such as a vacuum tube, a crystal or ceramic phonograph pickup, or a microphone, each of which may be a relatively high impedane device. Another difficulty which may be associated with the use of transistors in such circuits is that the direct current operating point of the transistors may vary with variations in temperature or when transistors are interchanged in the circuit, for example. As the operating point changes, signal distortion may result which is undesirable. A transistor amplifier which provides a high dynamic input impedance is described in United States Patent 2,900,456, issued on August 18, 1959 to James J. Davidson and entitled "Direct Coupled Feedback Transistor Amplifiers." It has been found that the circuits described in the aforementioned patent provide excellent operating point stabilization up to about 65° C. However for higher temperatures the operating bias point shifts and distortion may result.

It is accordingly an object of the present invention to provide an improved signal amplifier circuit utilizing transistors as active signal amplifying elements therein which is characterized by a high input impedance and stable circuit operation for temperatures in excess of 65° C.

It is another object of the present invention to provide an improved signal amplifier circuit wherein variations in the operating point of the transistors used therein are reduced for temperatures up to 100° C. and which has a relatively high dynamic input impedance.

An improved transistor amplifier circuit embodying the invention includes a pair of semi-conductor signal amplifying devices. An input signal from a high impedance source may, for example, be applied to the base electrode of the first transistor and an amplified output signal may be derived from the collector electrode of the second transistor. The collector of the first transistor is direct current conductively connected to the base of the second transistor through a Zener diode, to maintain a potential difference between these electrodes, while the emitter of the first transistor is direct current conductively coupled to the collector of the second transistor. The Zener diode is biased to provide a constant voltage thereacross so that any changes in the collector voltage of the first transistor due to variations in temperature or the like are applied to the base of the second transistor without attenuation. An amplifier circuit embodying the invention exhibits an enhanced forward gain and extends the temperature range of the circuit significantly above 65° C.

The connection from the collector of the second transistor to the emitter of the first provides alternating current signal feedback from the output of the second transistor to the input of the first transistor. Since the feedback signal is in phase with the input signal, the input impedance of the circuit is made relatively high. Accordingly, stable operation over an increased range of temperature as well as a high input impedance may be simultaneously achieved.

The novel features that are considered to be characteristic of this invention are set forth with particularity in the appended claims. The invention itself, however, both as to its organization and method of operation, as well as additional objects and advantages thereof, will best be understood from the following description when read in connection with the accompanying drawing in which the sole figure is a schematic circuit diagram of a transistor amplifier embodying the invention.

The amplifier circuit shown in the drawing includes a pair of junction transistors 10 and 20 of the same conductivity type which are shown as p-n-p type transistors. The transistors 10 and 20 include emitter electrodes 11 and 21, collector electrodes 12 and 22 and base electrodes 13 and 23 respectively. Input signals are applied to the circuit from a signal source, which may have a high impedance, through a pair of input terminals 14 and 15. The terminal 15 is connected to a point of reference potential or circuit ground, while the terminal 14 is connected to the base electrode 13 of the transistor 10. An amplifier output signal may be derived from a pair of output terminals 24 and 25. The terminal 25 is connected to the circuit ground point, while the output terminal 24 is connected to the collector 22 of the second transistor 20. To provide direct current biasing potential, for the transistors 10 and 20, a suitable D.C. voltage supply, such as a battery, not shown, is connected between a B— terminal and a ground B+ terminal. The negative, or B— terminal, is conected through respective load resistors 16 and 26 to the collectors 12 and 22 of the transistors 10 and 20 respectively. To provide a substantially fixed base bias voltage for the first transistor 10, the B— terminal of the D.C. power supply is connected through a pair of resistors 17 and 18, which form a voltage divider network, to the circuit ground point. A resistor 19 is connected from the junction of the voltage divider resistors 17 and 18 to the base electrode 13 of the transistor 10.

To provide operating point stabilization for the transistors 10 and 20 and at the same time achieve a high dynamic input impedance for the circuit in accordance with the invention, the collector 12 of the transistor 10 is direct current conductively connected through a Zener diode 27, to the base electrode 23 of he transistor 20, while the emitter 11 of the transistor 10 is direct current conductively connected to the collector 22 of the second transistor 20. The Zener diode 27 provides the necessary D.C. isolation between the collector 12 of the transistor 10 and the base 23 of the transistor 20. To complete the circuit, a capacitor 28 is connected from the emitter 11 of the first transistor 10 to the junction of the voltage divider resistors 17 and 18.

The transistor 20 circuit also includes a resistor 29 connected from the base electrode 23 to ground, and a stabilizing resistor 30, which is bypassed by a capacitor 31, connected from the emitter electrode to ground.

By connecting the electrodes of the transistors as shown and described, direct current and alternating current signal feedback are provided which simultaneously serve to stabilize the circuit operation and to effect the desired high input impedance for the amplifier circuit. The stabilizing feature of the invention can be demonstrated by assuming there is an increase in ambient temperature, for example, sufficient to cause the collector current of the first transistor 10 to increase. If the collector current of the transistor 10 increases due to any cause, the voltage across the collector load resistor 16 will increase causing the collector 12 to become less negative. The decreased negative voltage is coupled to the base electrode 23 of the second transistor 20 through the Zener diode 27 without attenuation. The decreased negative voltage applied to the base electrode 23 reduces the forward bias and thereby decreases the collector 22 current of the transistor 20. The collector 22 thus becomes more negative and hence a more negative voltage is applied to the emitter electrode 11 of the transistor 10. This more negative voltage decreases the forward bias of the transistor 10 which results in a collector 12 current which is reduced to substantially its previous level. An opposite sequence occurs if the collector 12 current of the transistor 10 decreases for any reason.

The stabilization of the transistor 20 is similar in that a decrease of current in the collector 22 decreases the forward bias voltage of the transistor 10 which decreases the current through the collector electrode 12. The voltage at the collector electrode 12 thus becomes more negative, and is applied to the base electrode 23 of the transistor 20 through the Zener diode 27. The forward bias between the emitter 21 and the base 23 is thus increased which increases the current through the collector electrode 22, returning the current to substantially its previous level. Therefore each transistor can be looked upon as the regulator of the operating point of the other transistor in a closed loop feedback circuit.

The Zener diode 27 in the closed loop circuit is poled so that D.C. current flows through it in the reverse direction. It will be noted that the transistors 10 and 20 are connected in series for direct current operation. The parameters of the circuit are selected so that the potential difference between the collector 12 of the transistor 10 and the base 23 of the transistor 20 is of the proper magnitude to bias the Zener diode 27 for operation at the inverse breakdown or Zener point. At the Zener operating point, the voltage across the diode remains substantially constant irrespective of the current flow through it. Therefore any change in voltage at the collector 12 appears unattenuated across the resistor 29. This means that a larger signal voltage is applied to the transistor 20 than would be the case if a resistor replaced the Zener diode, and accordingly the forward gain of the circuit is materially increased. Since the amount of temperature compensation is directly dependent on the forward gain of the circuit, the additional stabilization resulting from the inclusion of the Zener diode increases the upper temperature limit of the circuit to temperatures on the order of 1000° C.

It can also be demonstrated that by connecting the electrodes of the transistors as described, a high dynamic input impedance is provided for the circuit. This is accomplished by feeding back the signal voltage output from the collector 22 of the second transistor 20 to the emitter electrode 11 of the first transistor 10. If, for example, an input signal is applied to the input terminals 14 and 15, this signal will be applied to the base 13 of the transistor 10 or between the base 13 and circuit ground. The applied input signal will be amplified by the transistor 10 and applied between the base 23 and the emitter 21 of the transistor 20. The amplified signal voltage appearing in the collector 22 of the second transistor 20 is then fed back from the collector 22 to the emitter 11 of the first transistor 10, and coupled through the coupling capacitor 28 to the junction of the voltage divider resistors 17 and 18. Accordingly, the signal voltage at the emitter 11 of the first transistor 10, and the signal voltage at the junction of the voltage divider resistors 17 and 18 will be in phase with the input signal, and of substantially the same amplitude tending to oppose strongly any current flow from the input signal applied to the input terminals 14 and 15. In this manner, the feedback circuit will raise the input impedance and lower the output impedance. The resulting input impedance for any given application may be in the order of megohms. The circuit is also characterized by a relatively low output impedance and wide bandwidth.

The voltage divider network comprising the resistors 17 and 18 is effective to fix the direct current voltage at the base 13 of the first transistor 10 at a substantially fixed value. By connecting the capacitor 28 between the emitter 11 and the junction of these resistors, the signal voltage at the junction of these resistors will vary with variations in the output signal. The output signal is substantially equal to the input voltage. By connecting the base 13 to the junction point of the voltage divider resistors 17 and 18 through the resistor 19, which has resistance of a large enough magnitude to keep the base-to-emitter impedance of the transistor at some predetermined value but of small enough magnitude that the direct-current base current through the resistor causes a reasonably small voltage drop, the direct current voltage on the base 13 is held substantially fixed. Accordingly, the alternating current signal voltages which are applied to either end of the resistor 19 are substantially equal and in phase, creating a very high alternating current impedance on the base 13 for the amplifier circuit, while allowing a relatively low direct current impedance.

Operating point stabilization of transistor amplifier circuits embodying the invention is provided to effect stable circuit operation despite variations in temperature up to temperatures on the order of 100° C.

What is claimed is:

1. A stabilized signal amplifier circuit comprising in combination, a first transistor including base, emitter, and collector electrodes, signal input means connected for applying an input signal to said base electrode, a second transistor including base, emitter, and collector electrodes, signal output means connected between the collector and the emitter electrodes of said second transistor, means providing connections for applying biasing potential to said transistors, means including a Zener diode direct current conductively connecting the collector electrode of said first transistor and the base electrode of said second transistor to provide variation of the base voltage and collector current of said second transistor in response to collector current variation of said first transistor, said Zener diode being poled for reverse current flow to provide a substantially fixed potential drop across said Zener diode when said transistors are biased for signal amplification, and means providing a direct current conductive connection between the collector electrode of said second transistor and the emitter electrode of said first transistor to provide variation of the emitter voltage of said first transistor in response to collector current variation of said second transistor to stabilize the operation of said amplifier circuit.

2. A signal amplifier circuit comprising, in combination, a first transistor including base, emitter, and collector electrodes, a second transistor including base, emitter, and collector electrodes, means providing a signal input circuit for said amplifying circuit including a pair of input terminals, means connecting one of said terminals to a point of reference potential in said circuit, means coupling the other of said terminals to the base electrode of said first transistor for applying an input signal thereto, means providing a source of biasing potential connected to said point of reference potential, first resistive load means connecting the collector electrode of said first transistor with said source and providing variation in the collector voltage of said first transistor in response to collector current variation thereof, second resistive load means connecting the collector electrode of said second transistor with said source, means including a voltage divider network connecting the base electrode of said first transistor with said source, a capacitor connected from the emitter electrode of said first transistor to an intermediate point of said network, means coupling the emitter of said second transistor to said point of reference potential, a Zener diode, said Zener diode being the sole circuit element connecting the collector electrode of said first transistor to the base electrode of said second transistor to provide signal coupling and variation of the collector current of said second transistor in response to collector current variation of said first transistor, said Zener diode being poled for reverse current flow to provide a substantially fixed potential drop across said Zener diode when said transistors are biased for signal amplification, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected between the collector and emitter electrodes of said second transistor.

3. A stabilized signal amplifier circuit comprising in combination, a first transistor including base, emitter, and collector electrodes, signal input means connected for applying an input signal to said base electrode, a second transistor including base, emitter and collector electrodes, signal output means connected between the collector and emitter electrodes of said second transistor, means for receiving a biasing potential including a pair of terminals, first load resistance means connecting the collector electrode of said first transistor with one of said biasing potential terminals, second load resistance means connecting the collector electrode of said second transistor with said one biasing potential terminal, means coupling the emitter of said second transistor with the other biasing potential terminal, means including a Zener diode direct current conductively connecting the collector electrode of said first transistor to the base electrode of said second transistor to provide signal coupling and variation of the base voltage and collector current of said second transistor in response to collector current variation of said first transistor, said Zener diode being poled for reverse current flow to provide a substantially fixed potential drop across said Zener diode when said transistors are biased for signal amplification, and means providing a direct current conductive connection between the collector electrode of said second transistor and the emitter electrode of said first transistor to provide variation of the emitter voltage of said first transistor in response to collector current variation of said second transistor and in a direction to oppose collector current variation of said first transistor, for stabilizing the operation of said amplifier current.

4. A signal amplifier circuit comprising, in combination, a first transistor including base, emitter, and collector electrodes, a second transistor including base, emitter, and collector electrodes, signal input means including signal coupling means connected with said first base electrode for applying an input signal thereto, a capacitor connected between the emitter electrode of said first transistor and said signal coupling means, means including a Zener diode for a signal coupling and a direct current conductive connection between the collector electrode of said first transistor and the base electrode of said second transistor to provide signal translation therebetween and variation of the collector current of said second transistor in response to collector current variation of said first transistor, said Zener diode being poled for reverse current flow to provide a substantially fixed potential drop across said Zener diode when said transistors are biased for signal amplification, means providing a direct current conductive connection between the collector electrode of said second transistor and the emitter electrode of said first transistor to provide variation in the emitter voltage of said first transistor and signal feedback from the collector electrode of said second transistor to said input circuit through said capacitor for stabilizing the operation of said amplifying circuit and providing a high input impedance therefor, and means providing a signal output circuit connected between the collector and emitter electrodes of said second transistor.

5. A signal amplifier circuit comprising, in combination, a first transistor including base, emitter, and collector electrodes, a second transistor including base, emitter and collector electrodes, means providing an input circuit for said amplifying circuit including a pair of input terminals, means connecting one of said terminals to a point of reference potential in said circuit, means coupling the other of said terminals to the base electrode of said first transistor for applying an input signal thereto, means providing a source of biasing potential, first resistive load means connecting the collector electrode of said first transistor with said source and providing variation in the collector voltage of said first transistor in response to collector current variation thereof, second resistive load means connecting the collector electrode of said second transistor with said source, a voltage divided network including a pair of resistors connected between said source and said point of reference potential, a capacitor connected between the emitter electrode of said first transistor and the junction of said pair of resistors, a third resistor connected between the base electrode of said first transistor and the junction of said pair of resistors, means connecting the emitter electrode of said second transistor to said point of reference potential, means including a Zener diode for a signal coupling and a direct current conductive connection between the collector electrode of said first transistor and the base electrode of said second transistor to provide signal coupling therebetween and variation of the collector current of said second transistor in response to collector current variation of said first transistor, said Zener diode being poled for reverse current flow to provide a substantially fixed potential drop across said Zener diode when said transistors are biased for signal amplification, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected with the collector electrode of said second transistor.

6. A signal amplifier circuit comprising, in combination, a first transistor including base, emitter, and collector electrodes, a second transistor including base, emitter, and collector electrodes, means providing a signal input circuit for said amplifying circuit connected for applying an input signal to the base electrode of said first transistor, means providing a source of biasing potential connected with said first and second collector electrodes for applying biasing potential thereto, impedance means connecting the base electrode of said first transistor with said source, a capacitor connected between the emitter electrode of said first transistor and an intermediate point of said impedance means, means including a zener diode for a signal coupling and a direct current conductive connection between the collector electrode of said first transistor and the base electrode of said second transistor to provide signal coupling therebetween and variation of the collector current of said second transistor in response to collector current variation of said first transistor, said Zener diode being poled for reverse current flow to provide a substantially fixed potential drop across said Zener diode when said transistors are biased for signal amplification, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected between the emitter and the collector electrodes of said second transistor.

7. A signal amplifier circuit comprising in combination, a first transistor including base, emitter, and collector electrodes, signal input circuit means connected for applying an input signal to said base electrode, means providing a signal coupling connection between said emitter electrode and said signal input circuit means, a second transistor including base, emitter, and collector electrodes, signal output means connected for deriving an output signal from the collector electrode of said second transistor, means providing a source of biasing potential connected with said transistors for applying biasing potentials thereto, means including a Zener diode for a signal coupling and a direct current conductive connection between the collector electrode of said first transistor and the base electrode of said second transistor to provide signal coupling therebetween and variation of the base voltage of said second transistor in response to collector current variation of said first transistor, said Zener diode being poled for reverse current flow to provide a substantially fixed potential drop across said Zener diode when said transistors are biased for signal amplification, and means providing a direct current conductive connection between the collector electrode of said second transistor and the emitter electrode of said first transistor, said last named means being effective to provide variation of the operating point of said first transistor in response to variation of the operating point of said second transistor to stablize the operation of said amplifier circuit and to provide signal feedback to said input means through said signal coupling connection to increase the input impedance of said amplifier circuit.

References Cited in the file of this patent

UNITED STATES PATENTS

| | | |
|---|---|---|
| 2,714,702 | Shockley | Aug. 2, 1955 |
| 2,762,875 | Fischer | Sept. 11, 1956 |
| 2,847,519 | Aronson | Aug. 12, 1958 |
| 2,874,236 | Sikorra | Feb. 17, 1959 |
| 2,900,456 | Davidson | Aug. 18, 1959 |

UNITED STATES PATENT OFFICE

CERTIFICATE OF CORRECTION

Patent No. 3,080,528 March 5, 1963

James J. Davidson

It is hereby certified that error appears in the above numbered patent requiring correction and that the said Letters Patent should read as corrected below.

Column 1, line 20, for "impedane" read -- impedance --; column 2, line 23, for "amplifier" read -- amplified --; line 30, for "ground" read -- grounded --; line 46, for "he" read -- the --; column 3, line 46, for "1000° C." read -- 100° C. --; column 5, line 71, after "transistor" insert -- in response to collector current variation of said second transistor --; column 6, line 60, for "zener" read -- Zener --.

Signed and sealed this 1st day of October 1963.

(SEAL)
Attest:

ERNEST W. SWIDER

Attesting Officer

DAVID L. LADD

Commissioner of Patents